United States Patent
Hu et al.

(10) Patent No.: US 6,698,088 B2
(45) Date of Patent: Mar. 2, 2004

(54) UNIVERSAL CLAMPING MECHANISM

(75) Inventors: Ah Lek Hu, Melaka (MY); Sharon Mei Wan Ko, Melaka (MY); Peng Yeen Chan, Melaka (MY); Jaime Bayan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 464 days.

(21) Appl. No.: 09/776,287

(22) Filed: Feb. 1, 2001

(65) Prior Publication Data

US 2002/0100163 A1 Aug. 1, 2002

(51) Int. Cl.[7] .................................. B23P 19/00
(52) U.S. Cl. .............................. 29/743; 29/831; 29/840; 29/739
(58) Field of Search ...................... 29/827, 831, 840, 29/729, 739, 743, 744

(56) References Cited

U.S. PATENT DOCUMENTS

| | | | | |
|---|---|---|---|---|
| 3,667,103 A | * | 6/1972 | Petree | 29/737 |
| 3,704,504 A | * | 12/1972 | Koegler | 29/821 |
| 3,755,048 A | * | 8/1973 | Schubert | 156/541 |
| 3,930,295 A | * | 1/1976 | Rose | 29/759 |
| 4,037,830 A | * | 7/1977 | Poluzzi et al. | 269/21 |
| 4,906,011 A | * | 3/1990 | Hiyamizu et al. | 279/3 |
| 5,651,180 A | * | 7/1997 | Himmel et al. | 29/874 |

FOREIGN PATENT DOCUMENTS

JP         04085996 A    *    3/1992

* cited by examiner

*Primary Examiner*—Timothy V. Eley
(74) *Attorney, Agent, or Firm*—Beyer Weaver & Thomas, LLP

(57) ABSTRACT

A method is provided for processing a lead frame. Generally, a first surface of a lead frame base tape is placed on a first surface of the lead frame. A second surface of the lead frame base tape is placed on a first surface of a porous block. A vacuum is placed on a second surface of the porous block. A device for processing lead frames comprises a porous block with a first side and a second side, and a vacuum system connected to the first side of the porous block. The device may also include devices for attaching chips to the lead frame and wire bonding the chips to the lead frame.

13 Claims, 4 Drawing Sheets

UNIVERSAL CLAMPING MECHANISM

FIELD OF THE INVENTION

The present invention relates generally to integrated circuit packages. More specifically, the invention relates to the clamping of lead frames during the manufacturing of a Leadless Leadframe Package.

BACKGROUND OF THE INVENTION

An integrated circuit (IC) package encapsulates an IC chip (die) in a protective casing and may also provide power and signal distribution between the IC chip and an external printed circuit board (PCB). An IC package may use a metal lead frame to provide electrical paths for that distribution. During the process of die attach and wire bonding for conventional semiconductor packages, the semiconductor lead frame or substrate material rests on a base block during the epoxy dispensing, die attaching, and wire bonding processes. During these processes the frame or substrate needs to be held down firmly to a heater block by a vacuum, a clamp, or both.

To facilitate discussion, FIG. 1 is a top view of a lead frame panel 100 made up for a plurality of lead frames that may be used in the prior art. The lead frame may comprise leads 108, die attach pads 112, ties 116 for supporting the die attach pads 112 and leads 108, and a skirt 120 for supporting the plurality of leads 108 and ties 116. The lead frame panel 100 may be etched or stamped from a thin sheet of metal. FIG. 2 is a cross sectional view of the lead frame panel 100 shown in FIG. 1, along cut lines 2—2, attached to a lead frame base tape 204, which is mounted on a base block 208 used in the prior art. The base block 208 has a plurality of holes 212, through which a vacuum is applied to the lead frame base tape 204 to hold the lead frame 100 and the lead frame base tape 204 to the base block 208. A top clamp 216 may also be used to hold the lead frame 100 and lead frame base tape 204 to the base block 208. Preferably, the holes 212 are positioned at the die attach pads 112, not between the die attach pads 112 and the ties 116 or at the ties 116. As a result, a base block with a configuration of holes for one type of lead frame may not be useful in clamping another type of lead frame.

FIG. 3 is a cross sectional view of another type of lead frame 300 mounted on the base block 208 that is used in FIG. 2. Tape 304 is placed across the leads, die attach pads 312, the ties 308, and skirt 320 of the lead frame 300. The tape 304 and lead frame 300 are placed on the base block 208. Two vacuum holes 212 are under parts of the tape 304 connected to die attach pads 312 and two vacuum holes 212 are under tape 304 that is next to a gap between a lead 308 and a die attach pad 312. Placing a lead 308 or gap over a vacuum hole 212 may cause the lead frame to float or bounce during the wire bonding process. As a result, the vacuum provided through the base block 208, even in combination with a clamping 316 may not be sufficient to secure the lead frame during the wire bonding and die attach process.

It is desirable to provide a universal base block that is able to secure different lead frame configurations.

SUMMARY OF THE INVENTION

To achieve the foregoing and other objects and in accordance with the purpose of the present invention, a variety of techniques is provided for processing a lead frame. Generally, a first surface of a lead frame base tape is placed on a first surface of the lead frame. A second surface of the lead frame base tape is placed on a first surface of a porous block. A vacuum is placed on a second surface of the porous block.

Another aspect of the invention provides a device for processing lead frames, comprising a porous block with a first side and a second side, and a vacuum system connected to the first side of the porous block.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
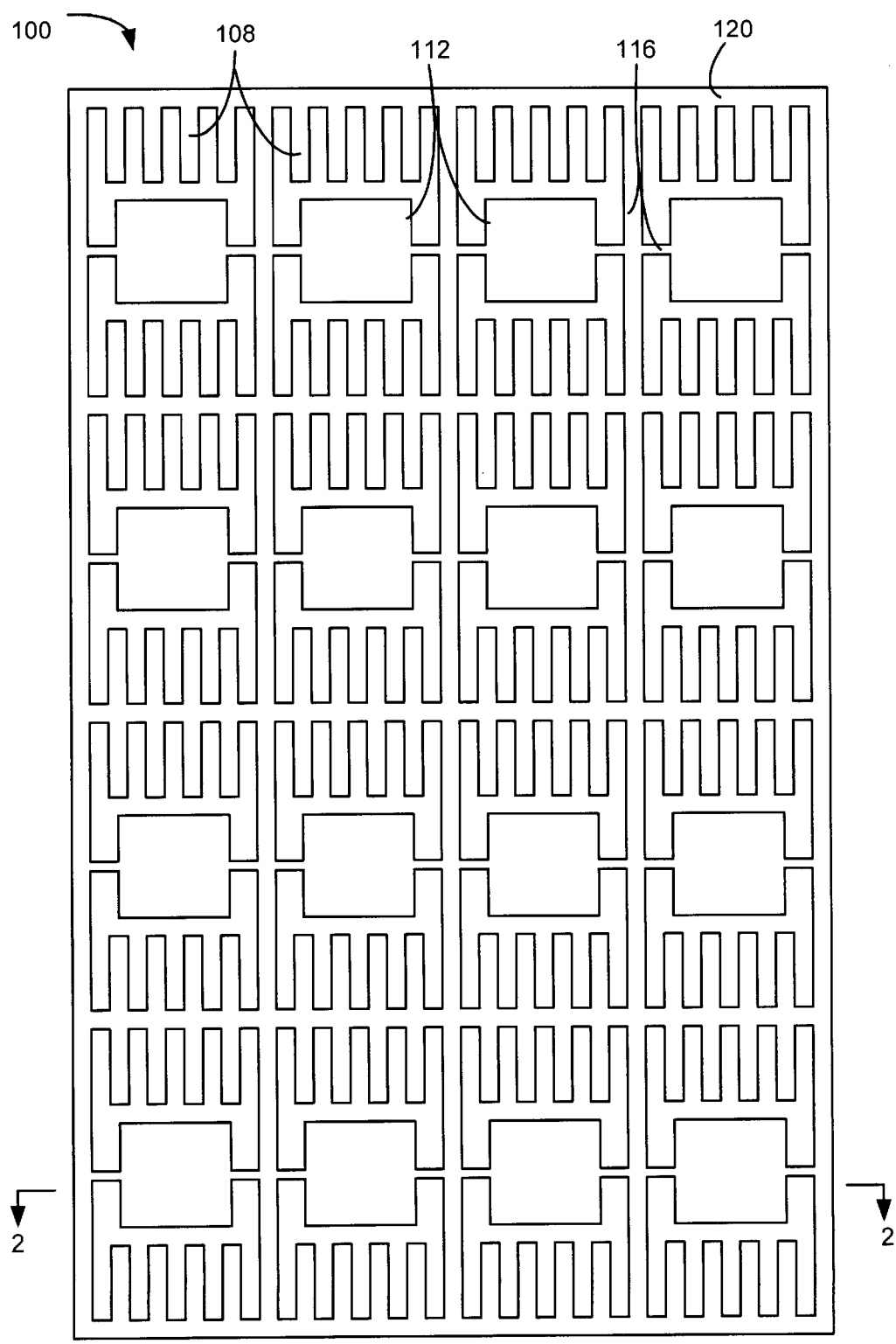
FIG. 1 is a plan view of a lead frame and die assembly used in the prior art.
Figure 2:
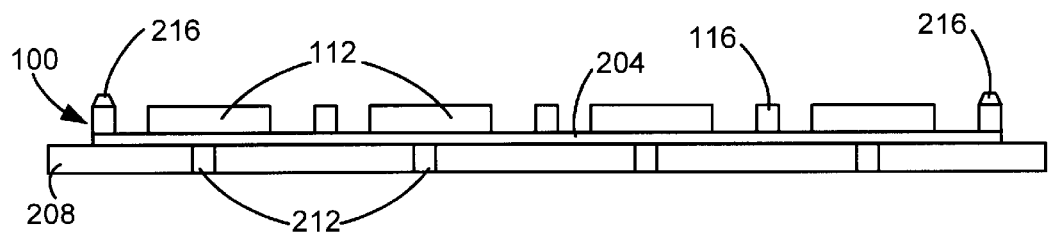
FIG. 2 is a cross sectional view of the lead frame panel shown in FIG. 1, along cut lines 2—2, attached to a lead frame base tape, which is mounted on a prior art base block.
Figure 3:
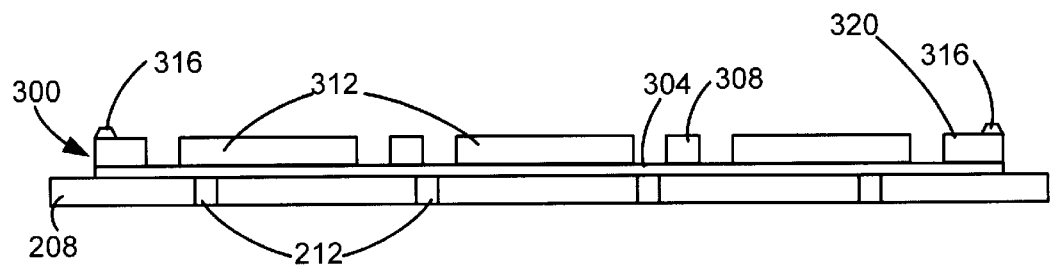
FIG. 3 is a cross sectional view of another type of lead frame mounted on the prior art base block that is used in FIG. 2.
Figure 4:
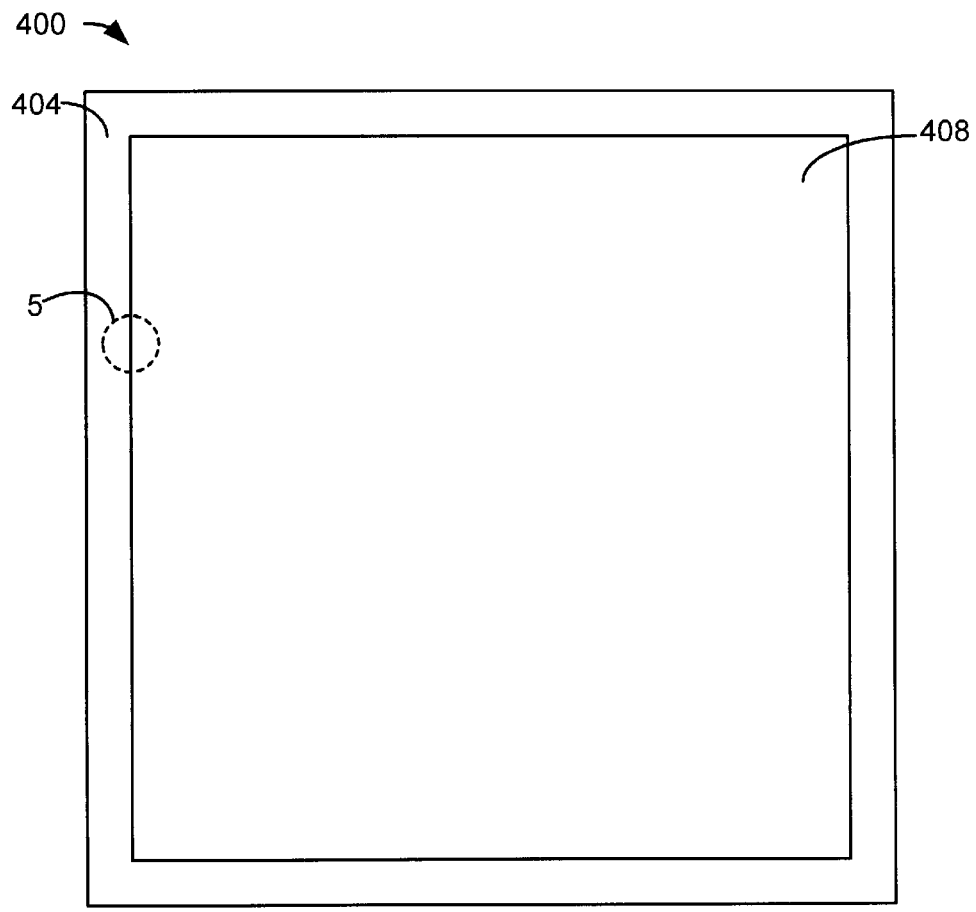
FIG. 4 is a top view of a base block used in a preferred embodiment of the invention.
Figure 5:
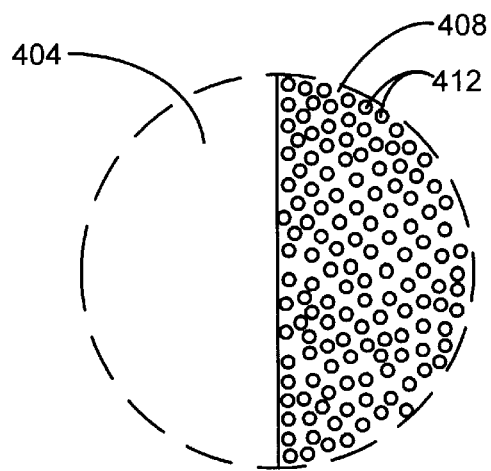
FIG. 5 is an enlarged view of part of the frame and porous block, shown in FIG. 4.

To facilitate discussion, FIG. 4 is a top view of a base block 400 used in a preferred embodiment of the invention. The base block 400 comprises a frame 404 and a porous block 408 mounted within the frame 404. FIG. 5 is an enlarged view of part of the frame 404 and porous block 408. The porous block 408 is defined as a block with a plurality of holes 412 on the upper surface of the porous block 408. The holes 412 have a diameter in the range of 0.005 mm to 2.00 mm. More preferably, the holes 412 have a diameter in the range of 0.005 mm to 1.50 mm. Most preferably, the holes 412 have a diameter in the range of 0.005 mm to 0.200 mm. The diameters of the holes 412 are set so that air passing through the holes will have a some resistance and yet wide enough to allow a vacuum pressure to be applied through the holes. The density of the holes are at least 5 holes per square centimeter. More preferably, the density of holes are at least 10 holes per square centimeter. Most preferably, the density of holes are at least 15 holes per square centimeter. Preferably, the ratio of the area of the holes to the area of the remainder of the upper surface of the porous block is at least 20%. More preferably, the ratio of the area of the holes to the area of the remainder of the upper surface of the porous block is at least 40%. Most preferably, the ratio of the area of the holes to the area of the remainder of the upper surface of the porous block is at least 60%.

Figure 6:
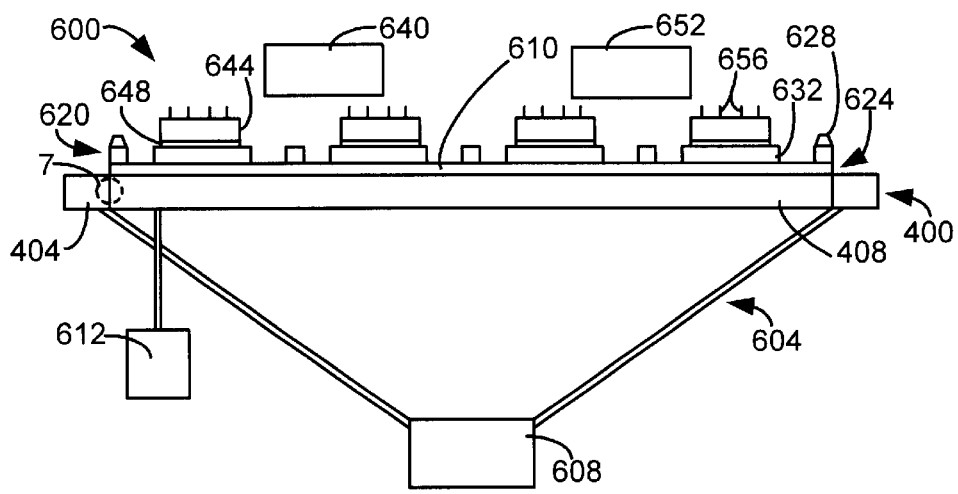
FIG. 6 is a cross-sectional schematic view of the base block being used in a die attach and wire bonding device.

FIG. 6 is a cross-sectional schematic view of the base block 400 being used in a die attach and wire bonding device 600. The base block 400 is mounted on a vacuum device 604, which uses an exhaust fan 608 to create a vacuum across the bottom side of the porous block 408 of the base block 400. A heater 612 is thermally connected to the base block 400, so that the heater 612 may heat the base block to temperatures on the order of 150° C. A lead frame 620 mounted on lead frame base tape 624 is placed on the top surface of the porous block 408 of the base block 400. A top clamp 628 may be used to help hold the lead frame 620 to the base block 400. In operation, the exhaust fan 608 and vacuum device 604 create a vacuum on the bottom surface of the porous block 408 of the base block 400. A further definition of the porous block 408 is that the porous block forms passageways between the holes on the top surface of the porous block 408 and the bottom surface of the porous block 408, so that the vacuum applied to the bottom surface of the porous block 408 generates a vacuum at the holes 412 (FIG. 5) at the top surface of the porous block 408. The vacuum is applied through the holes 412 (FIG. 5) to the lead frame base tape 610. Since the holes 412 are spaced to cover at least 60% of the surface of the base block 400, at least 50% of the lead frame base tape 624 connected to the die attach pad 632 will be held by the vacuum from the holes 412. The base block may provide an evenly distributed vacuum across the surface of the lead frame 624, which may provide a better holding without movement than the prior art. In addition, if a different lead frame is used with a different die attach pad, lead, and tie pattern the base block 400 would be able to provide an improved hold with the different lead frame. This allows the base block 400 to serve as a universal base block, which does not need to be changed when the lead frame pattern is changed.

A chip attaching device 640 is used to attach chips 644 to the die attach pads 632. The chip attaching device 640 may use an epoxy 648 to mechanically connect the chips 644 to the die attach pads 632. The heater 612 may then heat the base block 400 to about 150° C. A wire bonding device 652 may then be used to create wire bonds 656 between the chips 644 and leads of the lead frame 624. Heating the lead frame 624 to about 150° C. may help during the wire bonding process.

Figure 7:
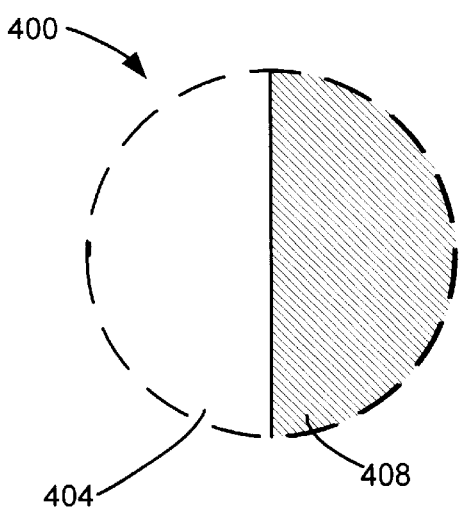
FIG. 7 is an enlarged cross-sectional view of part of the base block shown in FIG. 6.
Figure 8:
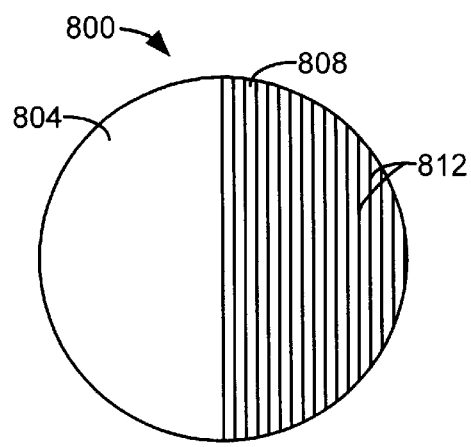
FIG. 8 is an enlarged cross-sectional view of an alternative base block in another embodiment of the invention.

The porous block 408 may be formed from any hard porous material on the market, such as ceramic or stone. However, in the case where conducting heat from a heater to the lead frame is done through the porous block 408, it is desirable to use a metal porous block. Such metal porous blocks may be naturally porous or a plurality of pin holes may be formed in the metal to form a metal porous block. FIG. 7 is an enlarged cross-sectional view of part of the base block shown in FIG. 6 in one embodiment of the invention. The base block 400 comprises the frame 404 and the porous block 408, which is shaded to indicate that the material of the porous block 408 is porous. FIG. 8 is an enlarged cross-sectional view of an alternative base block 800, which comprises a frame 804 and a porous block 808, which in this case is a solid block with a plurality of pin holes 812 that have placed through the porous block 808. The pin holes 812 may be formed using lasers or mechanical drills or by other methods. The pin holes may be in a uniform pattern or randomly distributed, as long as the pin holes are within the diameter range, density range, and area ratio range as described above. The pin holes or porousness allow the holes to be in fluid contact with the vacuum device 604.

In an alternative embodiment, especially if straight through pin holes are used, the base block may be made without a frame or the frame may be formed by outer walls of outer pin holes.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A universal clamping device for processing lead frames of various shapes and sizes, comprising:

a porous block with a first side and a second side, wherein the porous block comprises a plurality of holes on the second side of the porous block, wherein a density of the plurality of holes is at least 5 holes per square centimeter, wherein the first side of the porous block is the bottom side and the second side of the porous block is a top surface, and wherein the second side of the porous block is exposed to allow lead frames of various shapes and sizes to be placed on the second side of the porous block, so that the porous block may universally hold lead frames of various shapes and sizes;

a vacuum system connected to the first side of the porous block; and a chip attaching device on the second side of the porous block, for attaching chips to lead frames of various shapes and sizes.

2. The device, as recited in claim 1, wherein the diameter of each of the plurality of holes is less than 2.00 mm and wherein the plurality of holes are in fluid connection with the vacuum system.

3. The device, as recited in claim 1, further comprising a wire bonding device on the second side of the porous block.

4. The device, as recited in claim 3, further comprising a heater connected to the first side of the porous block.

5. The device, as recited in claim 4, wherein the plurality of holes have an area and the second side of the porous block has an area wherein the area of the holes and the area of the second side of the porous block have a ratio, wherein the ratio of the area of the holes to the area of the second side of the porous block is at least 20%.

6. The device, as recited in claim 5, further comprising a clamp for clamping a lead frame to the second side of the porous block.

7. The device, as recited in claim 1, further comprising a clamp for clamping a lead frame to the second side of the porous block.

8. The device, as recited in claim 7, wherein the porous block comprises a plurality of holes on the second side of the porous block wherein the diameter of each of the plurality of holes is between 0.005 mm to 0.200 mm.

9. A device for processing lead frames, comprising:

a porous block with a first side and a second side, wherein the porous block comprises a plurality of holes on the second side of the porous block, wherein the diameter of each of the plurality of holes is in the range of 0.005 mm to 2.00 mm;

a vacuum system connected to the first side of the porous block, wherein the plurality of holes on the second side of the porous block are in fluid connection with the vacuum system;

a heater connected to the first side of the porous block; and a chip attaching device on the second side of the porous block.

10. The device as recited in claim 9, wherein the first side of the porous block is the bottom side and the second side of the porous block is a top surface.

11. The device, as recited in claim 9, further comprising a wire bonding device on the second side of the porous block.

12. The device, as recited in claim 9, further comprising a clamp for clamping a lead frame to the second side of the porous block.

13. The device, as recited in claim 9, wherein the second side of the porous block is exposed to allow lead frames of various sizes and shapes to be placed on the second side of the porous block, so that the porous block may universally hold lead frames of various sizes and shapes.

* * * * *